United States Patent
Umeda et al.

(10) Patent No.: US 11,502,266 B2
(45) Date of Patent: Nov. 15, 2022

(54) LIGHT EMITTING ELEMENT COMPRISING QUANTUM DOTS AND METHOD FOR PRODUCING LIGHT EMITTING ELEMENT

(71) Applicant: SHARP KABUSHIKI KAISHA, Sakai (JP)

(72) Inventors: Tokiyoshi Umeda, Sakai (JP); Yuto Tsukamoto, Sakai (JP); Masayuki Kanehiro, Sakai (JP); Youhei Nakanishi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/041,430

(22) PCT Filed: Mar. 28, 2018

(86) PCT No.: PCT/JP2018/013033
§ 371 (c)(1),
(2) Date: Sep. 24, 2020

(87) PCT Pub. No.: WO2019/186847
PCT Pub. Date: Oct. 3, 2019

(65) Prior Publication Data
US 2021/0126216 A1   Apr. 29, 2021

(51) Int. Cl.
*H01L 51/50*   (2006.01)
*H01L 51/56*   (2006.01)

(52) U.S. Cl.
CPC ........ *H01L 51/5056* (2013.01); *H01L 51/502* (2013.01); *H01L 51/5004* (2013.01); *H01L 51/5072* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2006/0024524 A1 | 2/2006 | Tachikawa | |
| 2006/0199039 A1 | 9/2006 | Park et al. | |
| 2013/0070443 A1 | 3/2013 | Pan et al. | |
| 2017/0016592 A1 | 1/2017 | Pan et al. | |
| 2017/0062749 A1* | 3/2017 | Seo ........... | H01L 51/502 |
| 2017/0243916 A1* | 8/2017 | Zhu ........... | C09K 11/025 |

FOREIGN PATENT DOCUMENTS

| | | |
|---|---|---|
| JP | H10-69981 A | 3/1998 |
| JP | H11-8069 A | 1/1999 |
| JP | 2005-128539 A | 5/2005 |

(Continued)

*Primary Examiner* — Daniel Whalen
(74) *Attorney, Agent, or Firm* — ScienBiziP, P.C.

(57) ABSTRACT

A light-emitting element includes an anode electrode, a cathode electrode, a light-emitting layer, a positive hole transport layer, and an electron transport layer. The light-emitting layer, the positive hole transport layer, and the electron transport layer are provided between the anode electrode and the cathode electrode. The light-emitting layer includes QD phosphor particles, a positive hole transport substance configured to transport positive holes transported thereto by the positive hole transport layer, an electron transport substance configured to transport electrons transported thereto by the electron transport layer, and a photosensitive host material.

15 Claims, 11 Drawing Sheets

(56) References Cited

FOREIGN PATENT DOCUMENTS

| | | |
|---|---|---|
| JP | 2006-040741 A | 2/2006 |
| JP | 2007-042875 A | 2/2007 |
| JP | 2008-078590 A | 4/2008 |
| JP | 2017-062482 A | 3/2017 |
| JP | 2017-168420 A | 9/2017 |

* cited by examiner

LIGHT EMITTING ELEMENT COMPRISING QUANTUM DOTS AND METHOD FOR PRODUCING LIGHT EMITTING ELEMENT

TECHNICAL FIELD

The disclosure relates to a light-emitting element including quantum dot (QD) phosphor particles, and the like.

BACKGROUND ART

In recent years, for example, a light-emitting element including QD phosphor particles (also referred to as semiconductor nanoparticle phosphors) has been used as a light source of a display device. PTL 1 discloses an example of such a display device. The display device of PTL 1 is intended to generate monochromatic light or white light having a high color purity.

CITATION LIST

Patent Literature

PTL 1: JP 2017-62482 A

SUMMARY

Technical Problem

Nevertheless, in related art such as PTL 1, a photosensitive host having poor carrier transport properties is used in a light-emitting layer, and thus the transport properties of electrons or holes supplied from an electrode are insufficient. Therefore, such related art has problems in that a balance between an amount of positive holes and an amount of electrons supplied to the QD phosphor particles deteriorates, a luminous efficiency of the light-emitting element including the QD phosphor particles is low, and a service life of the light-emitting element including the QD phosphor particles is shortened.

An object of the disclosure is to realize a light-emitting element having a high luminous efficiency and a high durability, and a method for manufacturing the light-emitting element.

Solution to Problem

To solve the problems described above, a light-emitting apparatus according to one aspect of the disclosure includes an anode electrode, a cathode electrode, a light-emitting layer, a positive hole transport layer configured to transport positive holes supplied from the anode electrode to the light-emitting layer, and an electron transport layer configured to transport electrons supplied from the cathode electrode to the light-emitting layer. The light-emitting layer, the positive hole transport layer, and the electron transport layer are provided between the anode electrode and the cathode electrode. The light-emitting layer includes a photosensitive host material, quantum dot phosphor particles configured to emit light in association with a bonding of the positive holes and the electrons, and at least one of a positive hole transport substance configured to transport the positive holes transported thereto by the positive hole transport layer and an electron transport substance configured to transport the electrons transported thereto by the electron transport layer.

Further, to solve the problems described above, a method for manufacturing a light-emitting apparatus according to one aspect of the disclosure is a method for manufacturing a light-emitting element including an anode electrode, a cathode electrode, a light-emitting layer, a positive hole transport layer configured to transport positive holes supplied from the anode electrode to the light-emitting layer, and an electron transport layer configured to transport electrons supplied from the cathode electrode to the light-emitting layer, the light-emitting layer, the positive hole transport layer, and the electron transport layer being provided between the anode electrode and the cathode electrode. The method includes a light-emitting layer formation step of forming the light-emitting layer. The light-emitting layer formation step includes an application step of applying, on a base material, a liquid including a photosensitive host material, quantum dot phosphor particles configured to emit light in association with a bonding of the positive holes and the electrons, and at least one of a positive hole transport substance configured to transport the positive holes transported thereto by the positive hole transport layer and an electron transport substance configured to transport the electrons transported thereto by the electron transport layer, an exposure step of exposing the photosensitive host material, and a development step of developing the photosensitive host material. The photosensitive host material is developed and the light-emitting layer is patterned.

Advantageous Effects of Disclosure

According to the light-emitting apparatus according to one aspect of the disclosure, it is possible to realize a light-emitting element having a high luminous efficiency and a high durability, and a method for manufacturing the light-emitting element.

DESCRIPTION OF EMBODIMENTS

First Embodiment

Hereinafter, a first embodiment of the disclosure will be described in detail with reference to the drawings. A light-emitting apparatus 100 is an apparatus including a plurality of light-emitting elements 1 described later, and configured to emit light. The light-emitting apparatus 100 can be suitably applied to a display device or the like, for example. Description of members included in the light-emitting apparatus 100 but not related to the first embodiment will be omitted. It may be understood that the members for which descriptions are omitted are similar to those known in the art. Further, note that each drawing schematically describes a shape, a structure, and a positional relationship of each member, and is not necessarily drawn to scale.

Configuration of Light-Emitting Apparatus 100

Figure 1:
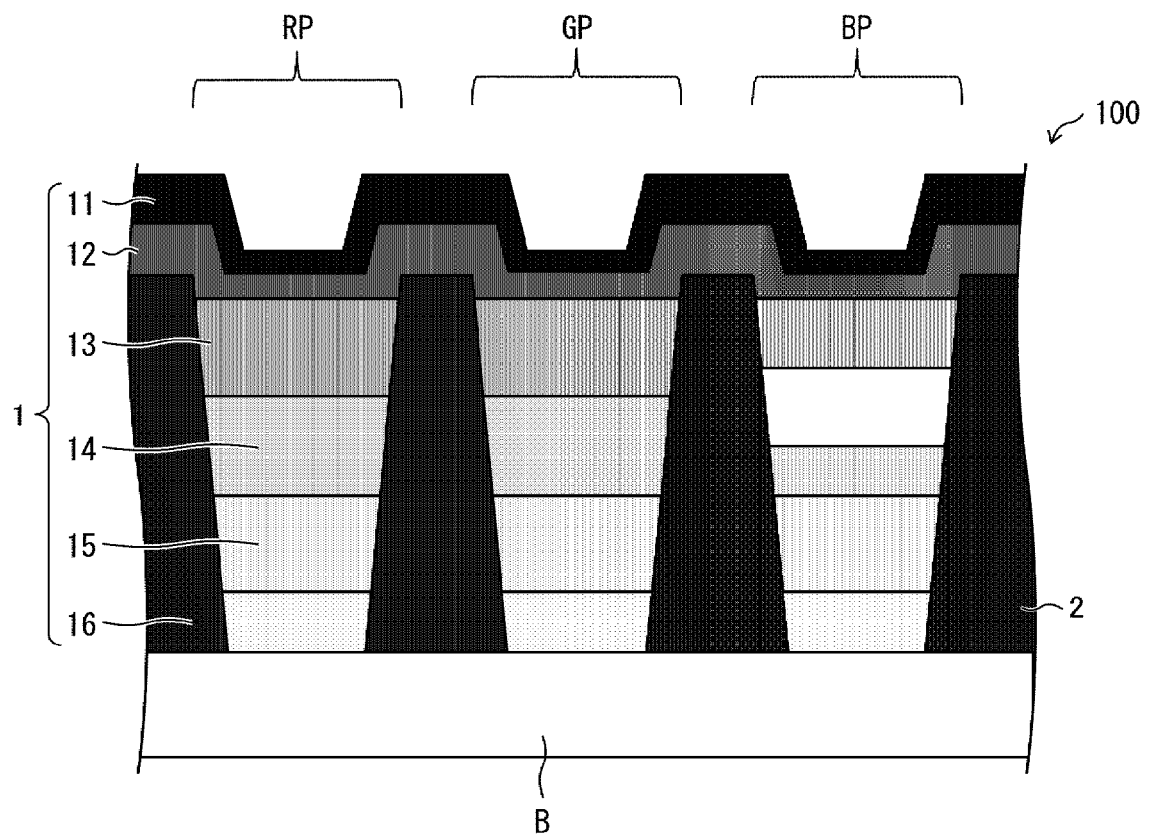
FIG. 1 is a drawing illustrating a schematic configuration of a light-emitting apparatus according to a first embodiment.

FIG. 1 is a drawing illustrating a schematic configuration of the light-emitting apparatus 100 according to the present embodiment. The light-emitting apparatus 100, as illustrated in FIG. 1, includes the plurality of light-emitting elements 1 formed on a substrate B on which a thin film transistor (TFT; not illustrated) is formed. The light-emitting apparatus 100 includes an edge cover 2 for preventing a short-circuit between electrodes. In the light-emitting apparatus 100, regions surrounded by the edge cover 2 are pixel regions (subpixels) of each color, and the light-emitting apparatus 100 includes a red pixel region RP, a green pixel region GP, and a blue pixel region BP. In the light-emitting apparatus 100, the light-emitting element 1 is formed for each of the red pixel region RP, the green pixel region GP, and the blue pixel region BP. Note that while, in the light-emitting apparatus 100, an electron transport layer 12 of the light-emitting element 1 formed for each of the red pixel region RP, the green pixel region GP, and the blue pixel region BP is commonly used, the electron transport layer 12 may be formed for each of the red pixel region RP, the green pixel region GP, and the blue pixel region BP.

Configuration of Light-Emitting Element 1

Figure 2:
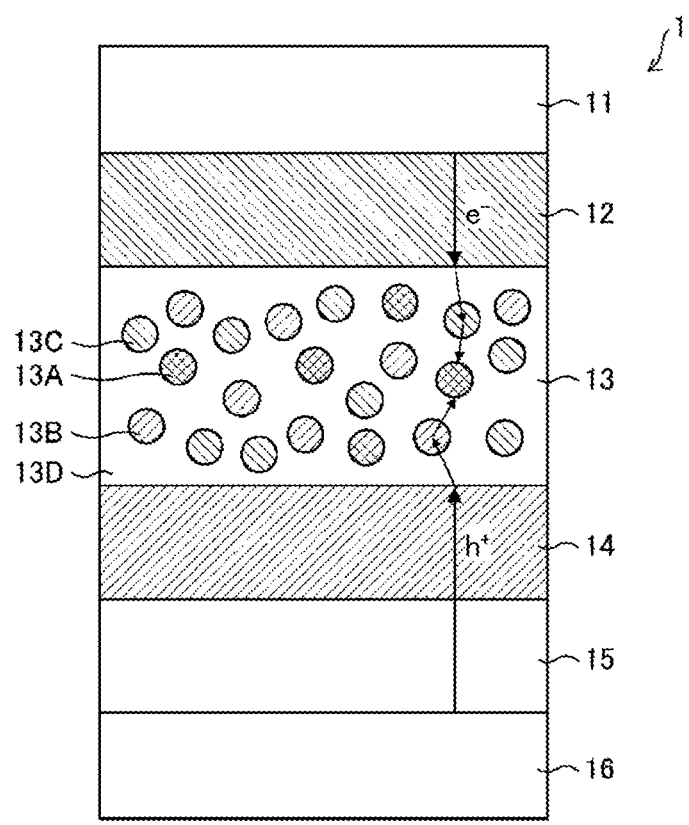
FIG. 2 is a drawing illustrating a schematic configuration of a light-emitting element 1 of the light-emitting apparatus.

FIG. 2 is a drawing illustrating a schematic configuration of the light-emitting element 1 according to the present embodiment. The light-emitting element 1, as illustrated in FIG. 2, includes a cathode electrode 11, the electron transport layer (ETL) 12, a light-emitting layer 13, a positive hole transport layer (HTL) 14, a positive hole injection layer (HIL) 15, and an anode electrode 16, in this order. The components from the cathode electrode 11 to the anode electrode 16 are supported by the substrate B provided below the anode electrode 16. Hereinafter, a direction from the anode electrode 16 to the cathode electrode 11 is referred to as an upward direction. A direction opposite to the upward direction is referred to as a downward direction. Note that, in the light-emitting element according to one aspect of the disclosure, an electron injection layer (EIL) may also be provided between the cathode electrode 11 and the electron transport layer 12.

The cathode electrode 11 (cathode) is an electrode that supplies electrons. The cathode electrode 11 is constituted by, for example, an Mg—Ag alloy. The cathode electrode 11 is a light-transmissive electrode that transmits light emitted from the light-emitting layer 13. The light-emitting apparatus 100 is configured as a top-emitting type light-emitting apparatus that emits the light emitted from the light-emitting layer 13 in the upward direction.

The anode electrode 16 (anode) is an electrode that supplies positive holes. The anode electrode 16 is constituted by, for example, a layered structure having a lower layer of an Ag—Pd—Cu alloy (APC), and an upper layer of indium tin oxide (ITO). The anode electrode 16 is a reflective electrode that reflects the light emitted from the light-emitting layer 13. According to this arrangement, among the light emitted from the light-emitting layer 13, light traveling downward can be reflected by the anode electrode 16. As a result, the light reflected by the anode electrode 16 can be directed to the cathode electrode 11 (upward). Therefore, a usage efficiency of the light emitted from the light-emitting layer 13 can be improved.

The electron transport layer 12 is a layer that transports electrons supplied by the cathode electrode 11 to the light-emitting layer 13. The electron transport layer 12 includes a material having excellent electron transport properties. According to the electron transport layer 12, the supply of electrons from the cathode electrode 11 to the light-emitting layer 13 can be promoted. The electron transport layer 12 may also have a role of an electron injection layer (EIL). The electron transport layer 12 may be a single layer or multilayer. The electron transport layer 12 may include ZnO nanoparticles, Alq3, PBD, TPBi, BCP, Balq, CDBP, or the like.

The positive hole injection layer 15 is a layer that promotes injection of positive holes supplied by the anode electrode 16 to the light-emitting layer 13. The positive hole injection layer 15 includes a material having excellent positive hole injection properties. The positive hole injection layer 15 may include PEDOT/PSS, and may include Clevios (trade name) AI4083, for example.

The positive hole transport layer 14 is a layer that transports the positive holes injected by the positive hole injection layer 15 to the light-emitting layer 13. The positive hole transport layer 14 includes a material having excellent positive hole transport properties. According to the positive hole injection layer 15 and the positive hole transport layer 14, it is possible to promote the supply of positive holes from the anode electrode 16 to the light-emitting layer 13. The positive hole transport layer 14 may be a single layer or multilayer.

The positive hole transport layer 14 may include an organic material such as PVK, poly-TPD, CBP, NPD, or TFB. Further, the positive hole transport layer 14 may include an inorganic material such as NiO or $MoO_3$.

The light-emitting layer 13 includes quantum dot phosphor particles 13A (QD phosphor particles), a positive hole transport substance 13B, an electron transport substance 13C, and a photosensitive host material 13D.

The QD phosphor particles 13A emit light in accordance with a bonding of the positive holes (holes) supplied from the anode electrode 16 (anode) and the electrons (free electrons) supplied from the cathode electrode 11 (cathode). The material of the QD phosphor particles 13A is a luminescent material (inorganic luminescent material, for example) with a valence band level and a conduction band level. In the QD phosphor particles 13A, excitons are generated in accordance with the bonding of the positive holes and the electrons. The QD phosphor particles 13A emit light in accordance with deactivation of the excitons. More specifically, the QD phosphor particles 13A emit light when the excitons excited from the valence band level to the conduction band level transition to the valence band level.

As an example, the material of the QD phosphor particles 13A may be at least one type of material (semiconductor material) selected from the group consisting of InP, InN, InAs, InSb, InBi, ZnO, $In_2O_3$, $Ga_2O_3$, $ZrO_2$, $In_2S_3$, $Ga_2S_3$, $In_2Se_3$, $Ga_2Se_3$, $In_2Te_3$, $Ga_2Te_3$, CdSe, CdTe, and CdS. More specifically, nano-sized crystals (semiconductor crystals) of the above semiconductor material are used as the material of the QD phosphor particles 13A.

Further, the QD phosphor particles 13A may also be core-shell structures, and may be, for example, core-shell structures such as CdSe/ZnSe, CdSe/ZnS, CdS/ZnSe, CdS/ZnS, ZnSe/ZnS, InP/ZnS, or ZnO/MgO.

In FIG. 2, the QD phosphor particles 13A having a spherical shape are exemplified. However, the shape of the QD phosphor particles 13A is not limited to a spherical shape. For example, the shape of the QD phosphor particles 13A may be a rod shape or a wire shape. Any shape known in the art may be applied to the shape of the QD phosphor particles 13A.

The QD phosphor particles 13A have a high luminous efficiency, and thus are suitable for improving the luminous efficiency of the light-emitting element 1. Further, by adjusting a size (particle diameter, for example) of the QD phosphor particles 13A, it is possible to control an energy band gap of the QD phosphor particles 13A. That is, by adjusting the particle diameter of the QD phosphor particles 13A, it is possible to control a wavelength (more specifically, wavelength spectrum) of the light emitted from the QD phosphor particles 13A.

Specifically, as the size of the QD phosphor particles 13A is reduced, a peak wavelength (wavelength at which the intensity peak in the wavelength spectrum can be obtained) of the light emitted from the QD phosphor particles 13A can be made shorter.

The positive hole transport substance 13B is a substance that transports the positive holes transported to the light-emitting layer 13 by the positive hole transport layer 14 to the QD phosphor particles 13A. As an example, the material of the positive hole transport substance 13B can be a carbazole derivative, a triazole derivative, an oxadiazole derivative, an imidazole derivative, an indolocarbazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, a porphyrin compound, an aniline copolymer, a conductive polymeric oligomer, in particular a thiophene oligomer, and the like. Of these, an aromatic tertiary amine compound and a styrylamine compound are preferably used, and the aromatic tertiary amine compound is more preferable. However, the material is not limited thereto. Furthermore, a polymeric material in which these materials are introduced into a polymer chain or these materials are a main chain of the polymer can be used. However, the material is not limited thereto.

When the positive hole transport substance 13B described above is used, positive hole mobility is high and a highest occupied molecular orbital (HOMO) level is shallow, making it possible to lower an energy barrier of positive hole transport from the anode electrode 16 to the QD phosphor particles 13A.

The electron transport substance 13C is a substance that transports electrons transported thereto by the electron transport layer 12 to the QD phosphor particles 13A. As an example, the material of the electron transport substance 13C can be an oxadiazole derivative, a nitro-substituted fluorene derivative, a diphenylquinone derivative, a thiopyranoxide derivative, carbodiimide, a fluorenylidenemethane derivative, anthraquinodimethane, an anthrone derivative, and the like. Further, as the material of the electron transport substance 13C, a thiadiazole derivative in which an oxygen atom of the oxadiazole ring is substituted with a sulfur atom, or a quinoxaline derivative having a quinoxaline ring known as an electron withdrawing substituent can also be used in the oxadiazole derivative above. Furthermore, the material of the electron transport substance 13C can be a polymer material in which these materials are introduced into a polymer chain or a polymer material in which these materials are a main chain of the polymer. The material, however, is not limited thereto.

When the electron transport substance 13C described above is used, electron mobility is high and a lowest unoccupied molecular orbital (LUMO) level is shallow, making it possible to lower an energy barrier of electron transport from the cathode electrode 11 to the QD phosphor particles 13A.

The photosensitive host material 13D is a material used for patterning the light-emitting layer 13 by exposure and development. The photosensitive host material 13D may include, for example, a photosensitive resin such as SU-8 (manufactured by Nippon Kayaku Co., Ltd.), the KI series (manufactured by Hitachi Chemical Co., Ltd.), AZ photoresist (manufactured by Merck & Co., Inc.), Sumiresist (manufactured by Sumitomo Chemical Co., Ltd.), or the like. Further, the photosensitive host material 13D may contain a photopolymerization initiator.

In the light-emitting layer 13, combined amounts of the positive hole transport substance 13B and the electron transport substance 13C are preferably, by ratio of the positive hole transport substance 13B to the electron transport substance 13C in mass %, 1:0.25 to 4. When the combination ratio of the positive hole transport substance 13B and the electron transport substance 13C is within the range described above, the transport of the positive holes or electrons to the QD phosphor particles 13A is carried out smoothly, and thus the carrier balance is favorable. On the other hand, when the combination ratio of the positive hole transport substance 13B and the electron transport substance 13C is outside the range described above, the transport of the positive holes or electrons to the QD phosphor particles 13A is not performed smoothly, and the carrier balance is poor.

In the light-emitting element 1, a forward voltage is applied between the anode electrode 16 and the cathode electrode 11 (the anode electrode 16 is set to a potential higher than that of the cathode electrode 11), thereby supplying electrons from the cathode electrode 11 to the light-emitting layer 13 and supplying positive holes from the anode electrode 16 to the light-emitting layer 13. Electrons supplied from the cathode electrode 11 are transported within the light-emitting layer 13 to the QD phosphor particles 13A via the electron transport substance 13C. Further, the positive holes supplied from the anode electrode 16 are transported within the light-emitting layer 13 to the QD phosphor particles 13A via the positive hole transport substance 13B. As a result, in the QD phosphor particles 13A, positive holes and electrons are bonded to each other, and light is generated. The application of the voltage described above may be controlled by the TFT described above.

In this way, the light-emitting layer 13 emits light by electroluminescence (EL; more specifically, injection type EL). The light-emitting layer 13 functions as a self-light-emitting type light-emitting element. According to the light-emitting layer 13, a known light-emitting diode (LED) is not required as a light source (backlight, for example) of various devices such as a display device or the like, for example. Therefore, the various devices described above having a smaller size can be realized.

As described above, in the light-emitting element 1, the light-emitting layer 13 includes the QD phosphor particles 13A configured to emit light in accordance with a bonding of the positive holes and the electrons, the positive hole transport substance 13B configured to transport the positive holes transported thereto by the positive hole transport layer 14, the electron transport substance 13C configured to transport the electrons transported thereto by the electron transport layer 12, and the photosensitive host material 13D. According to the configuration described above, in a case where the light-emitting layer 13 is manufactured using a photosensitive host material having poor carrier transport properties, the positive holes can be transported to the QD phosphor particles 13A by the positive hole transport substance 13B and the electrons can be transported to the QD phosphor particles 13A by the electron transport substance 13C in the light-emitting layer 13. That is, the transport properties of the positive holes and the electrons in an interior of the light-emitting layer 13 can be improved. Therefore, the balance between the amount of positive holes and the amount of electrons supplied to the QD phosphor particles 13A can be adjusted. As a result, the luminous efficiency of the QD phosphor particles 13A can be improved, and the service life of the light-emitting element 1 including the QD phosphor particles 13A can be lengthened.

Note that the light-emitting apparatus of the disclosure is not limited to a configuration in which the light-emitting layer 13 includes both the positive hole transport substance 13B and the electron transport substance 13C. In the light-emitting apparatus according to one aspect of the disclosure, a configuration may be employed in which only one of the positive hole transport substance 13B and the electron transport substance 13C is provided to adjust the balance between the amount of positive holes and the amount of electrons supplied to the QD phosphor particles 13A. However, a configuration in which both the positive hole transport substance 13B and the electron transport substance 13C are included makes it possible to further improve the luminous efficiency of the QD phosphor particles 13A, and is thus preferred.

Further, the light-emitting element according to one aspect of the disclosure may have a configuration in which the positive hole injection layer 15 is not included.

Further, in the light-emitting element according to one aspect of the disclosure, a substance having positive hole transport properties included in the positive hole transport layer 14 and the positive hole transport substance 13B included in the light-emitting layer 13 may be the same substance. Thus, a difference in HOMO level does not occur between the positive hole transport layer 14 and the light-emitting layer 13 (in other words, the HOMO level of the positive hole transport layer 14 and the HOMO level of the light-emitting layer 13 are the same level). As a result, the energy barrier when transporting the positive holes from the positive hole transport layer 14 to the light-emitting layer 13 can be eliminated, and thus the light-emitting element 1 can be driven at a low voltage.

Similarly, a substance having electron transport properties included in the electron transport layer 12 and the electron transport substance 13C included in the light-emitting layer 13 may be the same substance. Thus, a difference in LUMO level does not occur between the electron transport layer 12 and the light-emitting layer 13 (in other words, the LUMO level of the electron transport layer 12 and the LUMO level of the light-emitting layer 13 are the same level). As a result, the energy barrier when transporting the electrons from the electron transport layer 12 to the light-emitting layer 13 can be eliminated, and thus the light-emitting element 1 can be driven at a low voltage.

Further, in the light-emitting element according to one aspect of the disclosure, the substance having positive hole transport properties included in the positive hole transport layer 14 and the positive hole transport substance 13B included in the light-emitting layer 13 may be different substances. Thus, a carrier transport level can be adjusted by changing the positive hole transport substance 13B as appropriate. Further, similarly, the substance having electron transport properties included in the electron transport layer 12 and the electron transport substance 13C included in the light-emitting layer 13 may be different substances.

Method for Manufacturing Light-Emitting Element 1

Figure 3:
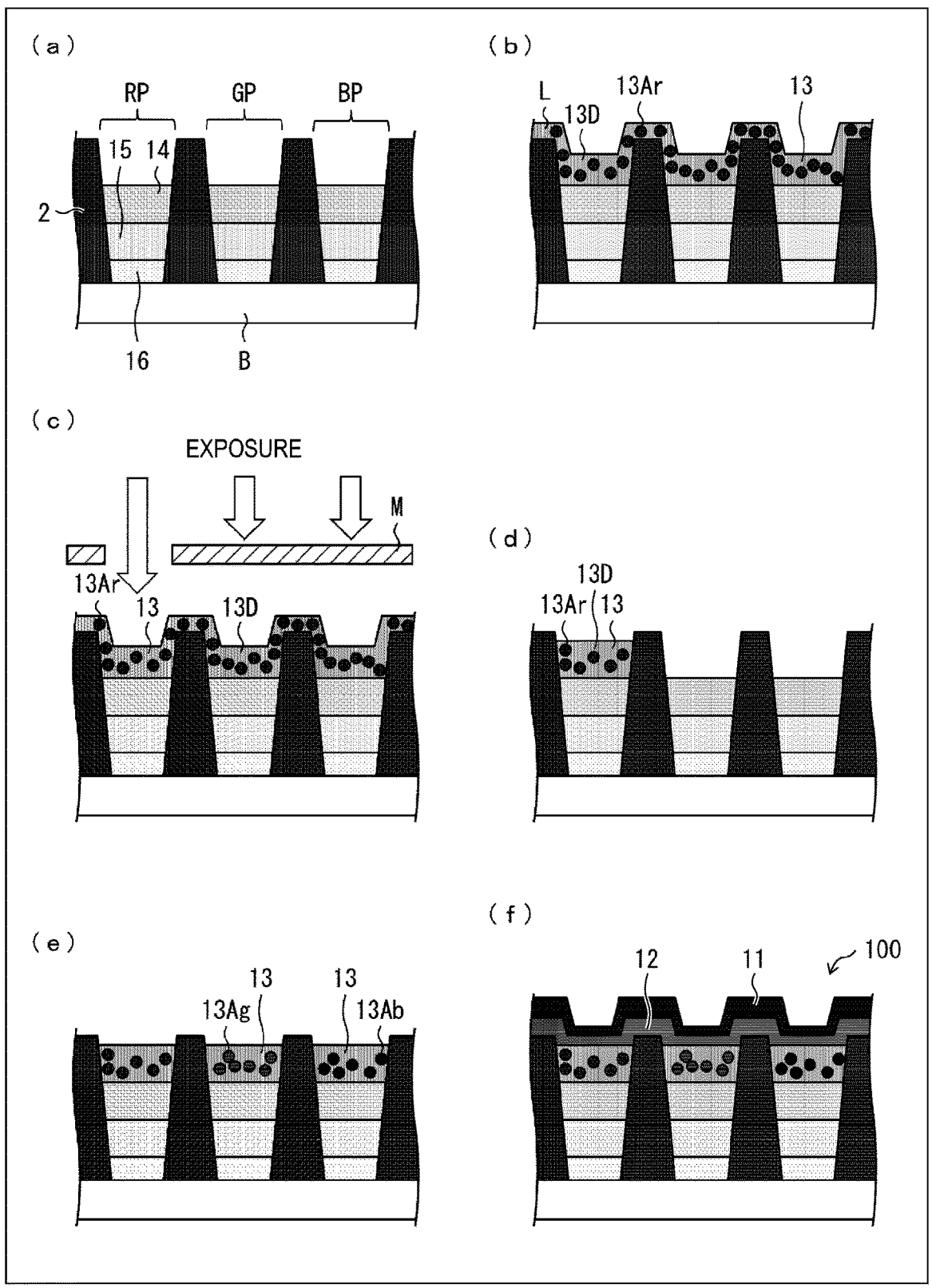
FIGS. 3(a) to (f) are process cross-sectional views for describing a method for manufacturing the light-emitting apparatus.
Figure 4:
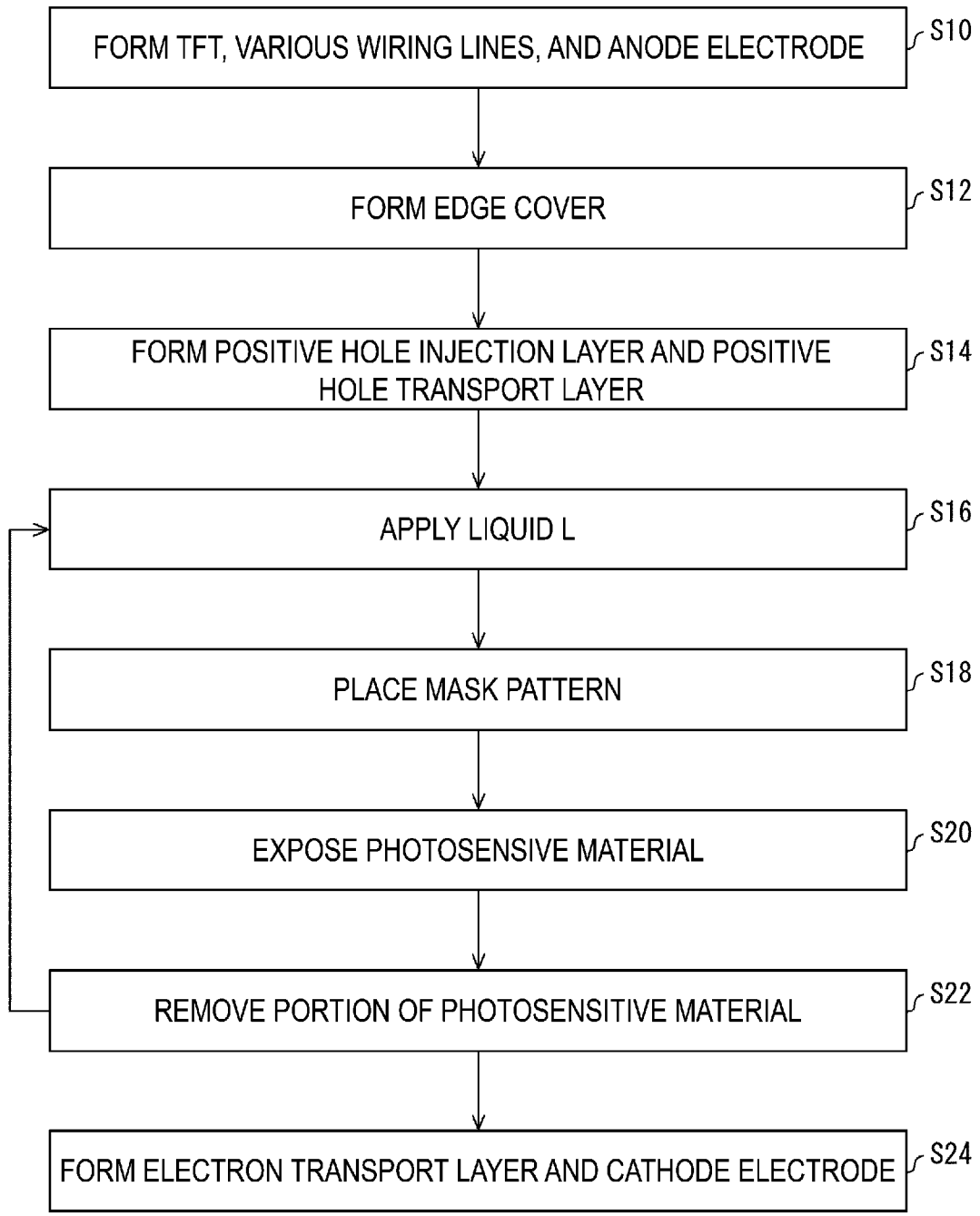
FIG. 4 is a flowchart illustrating an example of a method for manufacturing the light-emitting apparatus.

Next, a method for manufacturing the light-emitting apparatus 100 of the present embodiment will be described with reference to FIGS. 3 to 5. (a) to (f) of FIG. 3 are process cross-sectional views for describing the method for manufacturing the light-emitting apparatus 100. FIG. 4 is a flowchart illustrating an example of a method for manufacturing the light-emitting apparatus 100 according to the present embodiment.

First, the substrate B including a TFT and various wiring lines connected to the TFT is prepared, and the anode electrode 16 electrically connected to the TFT is formed on the substrate B (S10). Then, the edge cover 2 is formed on the anode electrode 16 (S12). Next, the positive hole injection layer 15 and the positive hole transport layer 14 are sequentially formed in the upper layer of the anode electrode 16 from below (S14). Thus, the structure illustrated in (a) of FIG. 3 is obtained. A known method may be employed as appropriate as the manufacturing method of each element heretofore.

Next, a film formation method of the light-emitting layer 13 (light-emitting layer formation step) will be described. The light-emitting layer 13 is manufactured by photolithography using a photosensitive host material in which quantum dots are dispersed. First, as illustrated in (b) of FIG. 3, the liquid L including a red QD phosphor particles 13Ar (QD phosphor particles 13A in the red pixel region RP), the positive hole transport substance 13B, the electron transport substance 13C, and the photosensitive host material 13D is applied to the positive hole transport layer 14 serving as a substrate (S16, application step). Note that, in FIG. 3, for the sake of simplicity, the positive hole transport substance 13B and the electron transport substance 13C are not illustrated. The liquid L may be applied by, for example, using a known method such as a printing method including a spin coating method, a spray coating method, a casting method, or an ink-jet method.

A concentration of the QD phosphor particles 13A relative to the photosensitive host material 13D may be selected as appropriate, making application easy and making it possible to obtain a desired film thickness. Specifically, the concentration of the QD phosphor particles 13A relative to the photosensitive host material 13D is preferably in a range of from 0.1 to 50 wt %. When the concentration is less than that described above, the desired light emission characteristics cannot be sufficiently obtained, and the light-emitting layer of the light-emitting apparatus cannot be formed. Further, when the range described above is exceeded, a stability of the formed film may be compromised due to an increase in the quantum dot component, and a flatness as well as a patterning accuracy may deteriorate.

Next, as illustrated in (c) of FIG. 3, a mask pattern M is placed above the film formed by applying the liquid L (S18), the mask pattern M is irradiated with light from above, and the photosensitive host material 13D is exposed (S20, exposure step). That is, in the photosensitive host material 13D, an exposed region is formed at a position where the mask pattern M is not upwardly present, and a non-exposed region is formed at a position where the mask pattern M is upwardly present. The light employed at the time of exposure may be, for example, i-line (wavelength of 365 nm), but may be selected as appropriate according to the material. Further, from the perspective of improving the pattern accuracy and reducing film thinning, the exposure amount is preferably not less than 20 mJ/cm$^2$. Further, from the perspective of suppressing a tact increase and reducing damage to other members, the exposure amount is preferably not greater than 1000 mJ/cm$^2$.

At this time, the mask pattern M is placed above the green pixel region GP, the blue pixel region BP, and the edge cover 2. Therefore, the light irradiated onto the green pixel region GP, the blue pixel region BP, and the edge cover 2 is a non-exposed region that is shielded by the mask pattern M. Thus, only the photosensitive host material 13D on the positive hole transport layer 14 formed in the red pixel region RP is exposed and is an exposed region. The photosensitive host material 13D in the exposed region changes, thereby forming the light-emitting layer 13.

Next, the photosensitive host material 13D is washed with a developing solution, and the photosensitive host material 13D is removed (S22, development step). The developing solution may be selected as appropriate according to the type of photosensitive host material 13D and, in the present embodiment, tetramethylammonium hydroxide (TMAH) is used as the developing solution. Here, the photosensitive host material 13D is a negative-working photosensitive host material that acquires poor solubility with respect to the developing solution by being exposed. Therefore, as illustrated in (d) of FIG. 3, only the light-emitting layer 13 in the exposed region does not dissolve in the developing solution, and remains on the positive hole transport layer 14. Thus, the light-emitting layer 13 including the red QD phosphor particles 13Ar is formed only in the red pixel region RP.

Note that while, in the present embodiment, a negative-working photosensitive host material is used as the photosensitive host material 13D, according to one aspect of the disclosure, a positive-working photosensitive host material may be used as the photosensitive host material 13D. However, use of the negative-working photosensitive host material is preferred because, at the time of exposure of different colors, light is not irradiated and damage to the light-emitting layer 13 does not readily occur. S16, S18, S20, and S22 described above are repeated to form the light-emitting layer 13 including green QD phosphor particles 13Ag in the green pixel region GP (QD phosphor particles 13A in the green pixel region GP), and blue QD phosphor particles 13Ab in the blue pixel region BP (QD phosphor particles 13A in the blue pixel region BP). Thus, the structure illustrated in (e) of FIG. 3 is obtained. Lastly, the electron transport layer 12 and the cathode electrode 11 are sequentially formed in the upper layer of the light-emitting layer 13 from below (S24). The electron transport layer 12 and the cathode electrode 11 may be formed using a sputtering method, a vacuum deposition method, or the like, in addition to the printing methods described above.

As described above, the light-emitting apparatus 100 illustrated in (f) of FIG. 3 is manufactured. Note that, in the manufacturing process of the light-emitting apparatus 100 described above, in practice, after the application of the liquid L, prebaking may be performed in order to remove solvent from the liquid L. Further, after development of the light-emitting layer 13, postbaking may be performed in order to ensure adhesion with the substrate and improve resistance to treatments in post processes.

Figure 5:
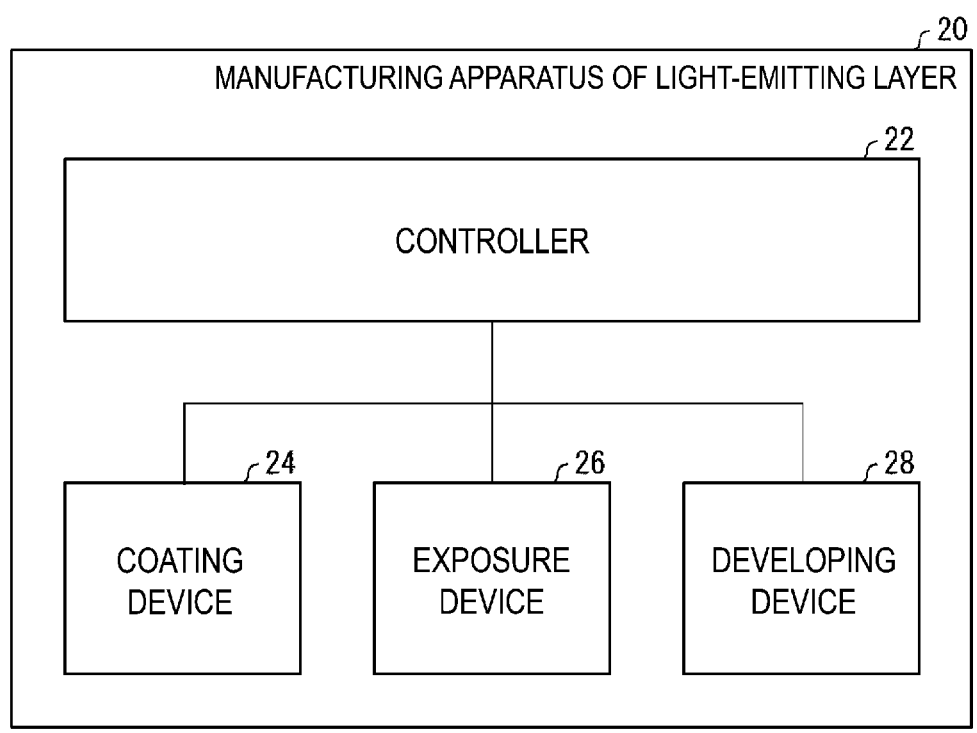
FIG. 5 is a block diagram illustrating a manufacturing apparatus of a light-emitting layer used during manufacture of a light-emitting layer in a manufacturing process of the light-emitting apparatus.

FIG. 5 is a block diagram illustrating a manufacturing apparatus 20 of a light-emitting layer used during manufacture of the light-emitting layer 13 in the manufacturing process of the light-emitting apparatus 100 described above. The manufacturing apparatus 20 of the light-emitting layer includes a controller 22, a coating device 24, an exposure device 26, and a developing device 28. The coating device 24 applies the liquid L including the QD phosphor particles 13A, the positive hole transport substance 13B, the electron transport substance 13C, and the photosensitive host material 13D onto the substrate (that is, positive hole transport layer 14). The exposure device 26 places the mask pattern M above the film formed by applying the liquid L onto the substrate, and irradiates at least a portion of the film with light. After the film is irradiated with light, the developing device 28 removes at least a portion of the photosensitive host material 13D. The controller 22 controls the coating device 24, the exposure device 26, and the developing device 28. These manufacturing processes are preferably performed in an inert gas atmosphere such as nitrogen.

In the manufacturing method described above, there is no high temperature process during or after formation of the light-emitting layer 13 that includes the QD phosphor particles 13A. Thus, the possibility that the light emission characteristics of the QD phosphor particles 13A will be deactivated and fluorescence will no longer occur is reduced. Thus, the manufacturing method described above improves the yield of manufacture of the light-emitting apparatus 100. Further, in the manufacturing method described above, the light-emitting layer 13 can be formed using photolithography. Therefore, the light-emitting layer 13 can be formed with favorable patterning accuracy, suppressing an increase in takt time. Accordingly, the manufacturing method described above makes it easier to increase the size and improve the definition of the light-emitting apparatus 100, and thus is more suitable for mass production.

Further, in the manufacturing method described above, the QD phosphor particles 13A are dispersed in the interior of the photosensitive host material 13D or the light-emitting layer 13. Thus, during formation of the light-emitting layer 13 or in a process after formation of the light-emitting layer 13, direct contact of the QD phosphor particles 13A with oxygen, moisture, or the like is reduced, making it possible to reduce damage to the QD phosphor particles 13A. Thus, the manufacturing method described above further improves the yield of manufacture of the light-emitting apparatus 100.

Modification Example

The light-emitting apparatus 100 may be configured as a bottom-emitting type light-emitting apparatus. That is, the light-emitting apparatus 100 may be configured to emit light emitted from the light-emitting layer 13 in the downward direction. Specifically, use of a reflective electrode as the cathode electrode 11 and a light-transmissive electrode as the anode electrode 16 makes it possible to achieve the light-emitting apparatus 100 of a bottom-emitting type. In the bottom-emitting type light-emitting apparatus 100, the substrate B provided below the anode electrode 16 is a light-transmissive substrate (a glass substrate, for example).

Second Embodiment

Another embodiment of the disclosure will be described below. Note that, for convenience of description, members having the same function as the members stated in the embodiment above are designated by the same reference signs, and descriptions thereof are omitted.

A light-emitting element 1A of the present embodiment differs from the light-emitting element 1 of the first embodiment in the order in which the members are layered.

Figure 6:
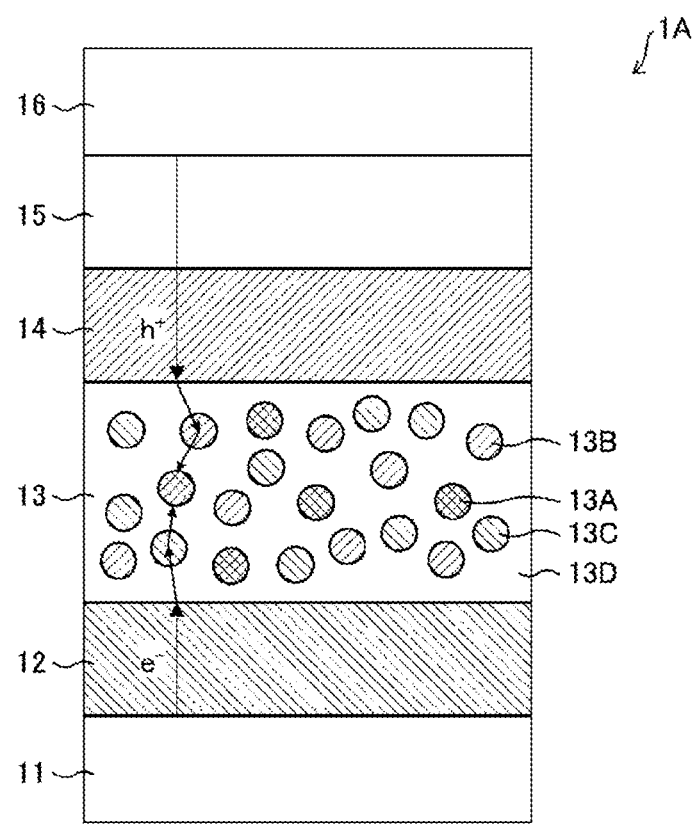
FIG. 6 is a drawing illustrating a schematic configuration of a light-emitting element according to a second embodiment.

FIG. 6 is a drawing illustrating a schematic configuration of the light-emitting element 1A. As illustrated in FIG. 6, in the light-emitting element 1A, the cathode electrode 11, the electron transport layer 12, the light-emitting layer 13, the positive hole transport layer 14, the positive hole injection layer 15, and the anode electrode 16 are formed to be layered, in this order, from bottom to top. The components between the cathode electrode 11 and the anode electrode 16 are supported by a substrate (not illustrated) provided below the cathode electrode 11.

In the light-emitting element 1A having the configuration described above as well, similar to the light-emitting element 1 of the first embodiment, the light-emitting layer 13 includes the QD phosphor particles 13A, the positive hole transport substance 13B, the electron transport substance 13C, and the photosensitive host material 13D, and thus the transport properties of the positive holes and the electrons in the interior of the light-emitting layer 13 can be improved. Thus, the balance between the amount of positive holes and the amount of electrons supplied to the QD phosphor particles 13A can be adjusted. As a result, the luminous efficiency of the QD phosphor particles 13A can be improved, and the service life of the QD phosphor particles 13A can be lengthened.

Third Embodiment

Figure 7:
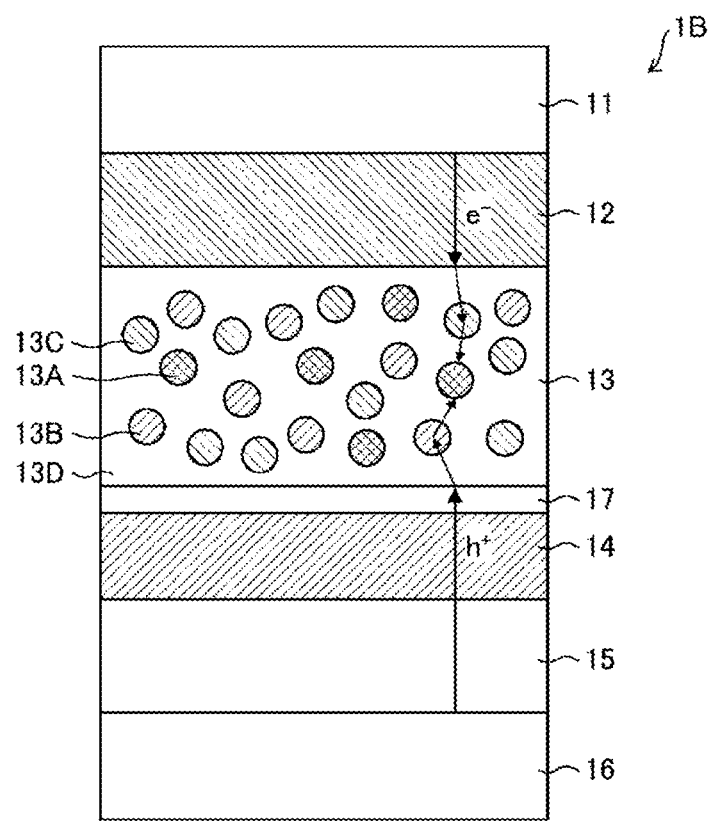
FIG. 7 is a drawing illustrating a schematic configuration of a light-emitting element according to a third embodiment.

FIG. 7 is a drawing illustrating a schematic configuration of a light-emitting element 1B according to the present embodiment. As illustrated in FIG. 7, in addition to the configuration of the light-emitting element 1 in the first embodiment, the light-emitting element 1B includes an electron blocking layer 17 between the positive hole transport layer 14 and the light-emitting layer 13. The electron blocking layer 17 is formed from the same material as the photosensitive host material 13D included in the light-emitting layer 13.

According to the configuration described above, electrons injected from the cathode electrode 11 side can be confined to the light-emitting layer 13 by the electron blocking layer 17 while the positive holes are transported from the positive hole transport layer 14 to the light-emitting layer 13.

Figure 8:
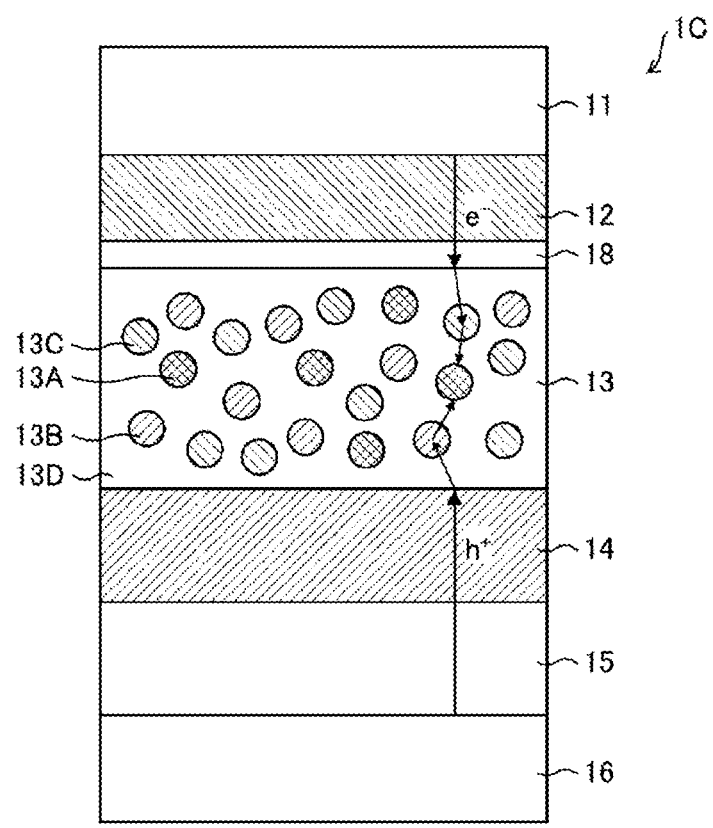
FIG. 8 is a drawing illustrating a schematic configuration of a light-emitting element according to a fourth embodiment.

Further, in the light-emitting element according to one aspect of the disclosure, the electron blocking layer 17 may be constituted by the photosensitive host material 13D and the positive hole transport substance 13B. According to the configuration described above, the electrons injected from the cathode electrode 11 side can be confined to the light-emitting layer 13 by the electron blocking layer 17 while the positive holes can be efficiently transported from the positive hole transport layer 14 to the light-emitting layer Fourth Embodiment FIG. 8 is a drawing illustrating a schematic configuration of a light-emitting element 1C according to the present embodiment. As illustrated in FIG. 8, in addition to the configuration of the light-emitting element 1 in the first embodiment, the light-emitting element 1C includes a positive hole blocking layer 18 between the electron transport layer 12 and the light-emitting layer 13. The positive hole blocking layer 18 is formed from the same material as the photosensitive host material 13D included in the light-emitting layer 13.

According to the configuration described above, the positive holes injected from the anode electrode 16 side can be confined to the light-emitting layer 13 by the positive hole blocking layer 18 while the electrons are transported from the electron transport layer 12 to the light-emitting layer 13.

Further, in the light-emitting element according to one aspect of the disclosure, the positive hole blocking layer 18 may be constituted by the photosensitive host material 13D and the electron transport substance 13C. According to the configuration described above, the positive holes injected from the anode electrode 16 side can be confined to the light-emitting layer 13 by the positive hole blocking layer 18 while the electrons can be efficiently transported from the electron transport layer 12 to the light-emitting layer 13.

Fifth Embodiment

Hereinafter, a light-emitting apparatus 100A according to another embodiment of the disclosure will be described with reference to the drawings. Note that, for convenience of description, members having the same function as the members stated in the first embodiment are designated by the same reference signs, and descriptions thereof are omitted.

Figure 9:
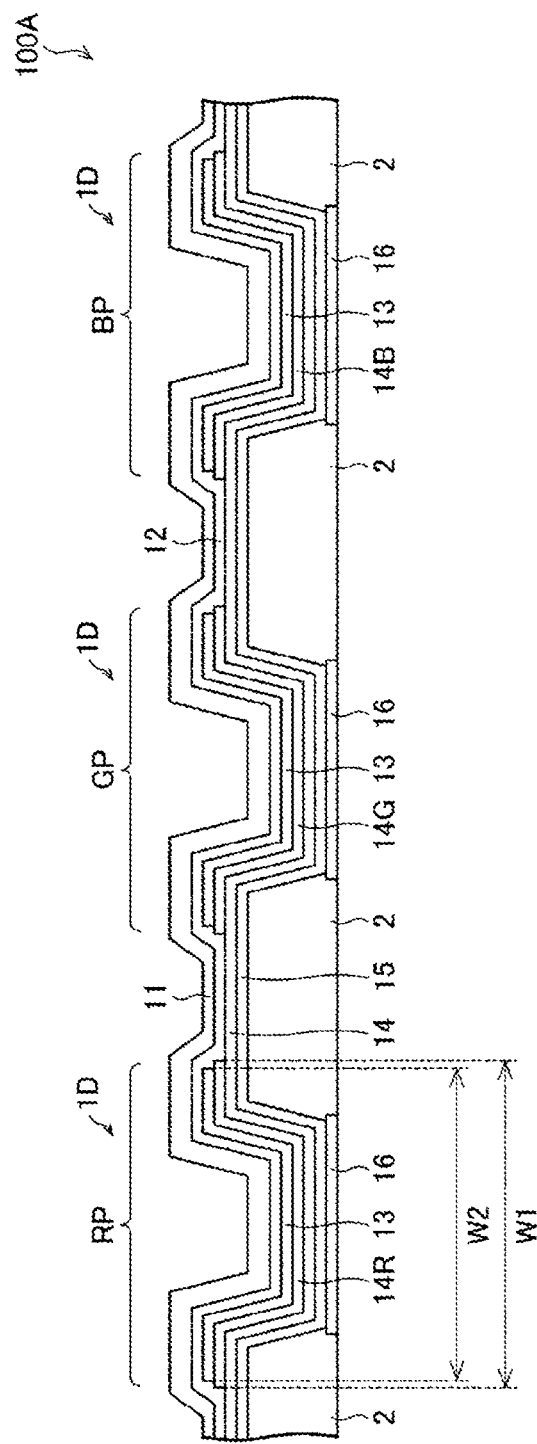
FIG. 9 is a drawing illustrating a schematic configuration of a light-emitting apparatus according to a fifth embodiment.

FIG. 9 is a drawing illustrating a schematic configuration of the light-emitting apparatus 100A. As illustrated in FIG. 9, the light-emitting apparatus 100A includes a plurality of light-emitting elements 1D. In the light-emitting apparatus 100A, regions surrounded by the edge cover 2 are pixel regions (subpixels) of each color, and the light-emitting apparatus 100A includes the red pixel region RP, the green pixel region GP, and the blue pixel region BP.

In addition to the configuration of the light-emitting element 1 in the first embodiment, the light-emitting elements 1D include second positive hole transport layers 14R, 14G, 14B. Specifically, the light-emitting element 1D in the red pixel region RP includes the cathode electrode 11, the electron transport layer 12, the light-emitting layer 13, the second positive hole transport layer 14R, the positive hole transport layer 14, the positive hole injection layer 15, and the anode electrode 16, in this order.

In the light-emitting apparatus 100A, the positive hole injection layer 15, the positive hole transport layer 14, the electron transport layer 12, and the cathode electrode 11 of the light-emitting element 1D formed for each of the red pixel region RP, the green pixel region GP, and the blue pixel region BP are commonly used.

The light-emitting apparatus 100A and the light-emitting element 1D of the present embodiment are manufactured by the following procedure. First, the anode electrode 16 electrically connected to the TFT is formed on the substrate B. Then, the edge cover 2 is formed on the anode electrode 16. Next, the positive hole injection layer 15 and the positive hole transport layer 14 are sequentially formed in the upper layer of the anode electrode 16 from below. The positive hole injection layer 15 and the positive hole transport layer 14 can be formed by being applied by a spin coating method, a spray coating method, an ink-jet method, or the like, or by vapor deposition using an open mask. Note that, in the present embodiment, the positive hole injection layer 15 and the positive hole transport layer 14 are commonly formed in each subpixel. Next, the second positive hole transport layers 14R, 14G, 14B are formed using a fine metal mask (FMM) for the red pixel region RP, the green pixel region GP, and the blue pixel region BP. Next, the light-emitting layer 13 is formed for each of the red pixel region RP, the green pixel region GP, and the blue pixel region BP by photolithography. Lastly, the electron transport layer 12 and the cathode electrode 11 are sequentially formed in the upper layer of the light-emitting layer 13 from below. In the present embodiment, the electron transport layer 12 and the cathode electrode 11 are commonly formed in each subpixel.

In the present embodiment, the edge cover 2 is formed between the anode electrode 16 and the light-emitting layer 13, as illustrated in FIG. 9. The edge cover 2 covers a peripheral edge of the anode electrode 16 and includes an opening exposing a portion of the anode electrode 16.

In the light-emitting element 1D, the light-emitting layer 13 and the second positive hole transport layers 14R, 14G, 14B are formed covering the opening of the edge cover 2, a side surface of the opening of the edge cover 2, and a portion of an upper edge of the edge cover 2.

In the light-emitting element 1D, each region where the positive hole transport layer 14 and the second positive hole transport layers 14R, 14G, 14B overlap functions as a positive hole transport layer.

In the light-emitting element 1D, as illustrated in FIG. 9, the light-emitting layer 13 is formed having a width W1 of each region where the positive hole transport layer 14 and the second positive hole transport layers 14R, 14G, 14B overlap greater than a width W2 of the light-emitting layer 13. Note that, in FIG. 9, for the sake of simplicity, the width W1 and the width W2 are illustrated in the red pixel region RP only. As described above, by forming the light-emitting layer 13, it is possible to ensure that color mixing of the light emitted from the light-emitting element 1D of each of the red pixel region RP, the green pixel region GP, and the blue pixel region BP does not occur, even if a vapor deposition displacement occurs when the second positive hole transport layers 14R, 14G, 14B are formed by vapor deposition.

Here, in the present embodiment, as described above, the light-emitting layer 13 is formed by photolithography capable of patterning with high accuracy. Therefore, as described above, the light-emitting layer 13 can be formed having the width W1 of each region where the positive hole transport layer 14 and the second positive hole transport layers 14R, 14G, 14B overlap greater than the width W2 of the light-emitting layer 13.

Note that, in the light-emitting element according to one aspect of the disclosure, the second positive hole transport layer 14B can be omitted in the blue pixel region BP in a case where the positive hole transport layer 14 can be substituted.

Sixth Embodiment

Hereinafter, a light-emitting apparatus 100B according to another embodiment of the disclosure will be described with reference to the drawings. Note that, for convenience of description, members having the same function as the members stated in the first embodiment are designated by the same reference signs, and descriptions thereof are omitted.

Figure 10:
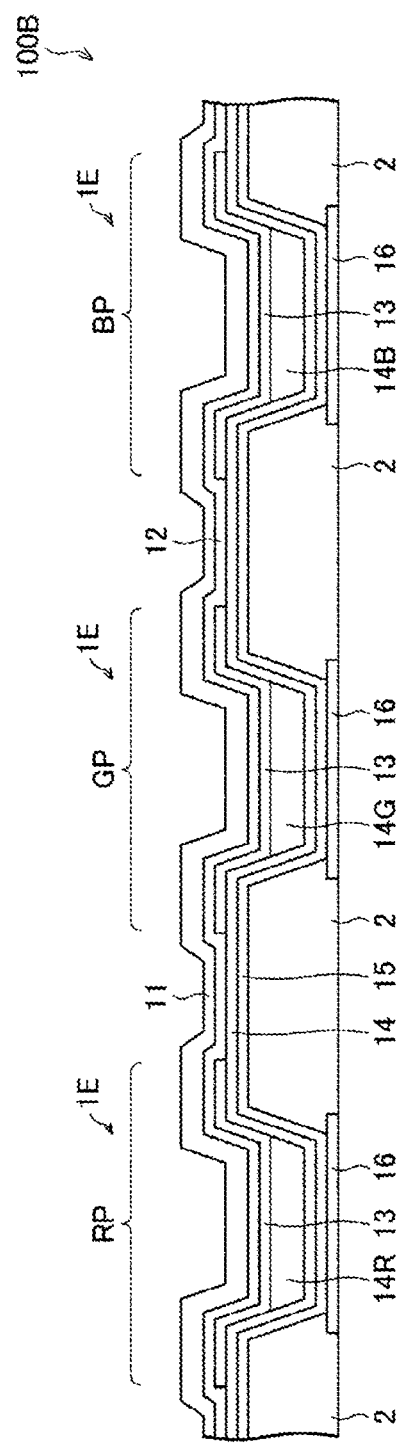
FIG. 10 is a drawing illustrating a schematic configuration of a light-emitting apparatus according to a sixth embodiment.

FIG. 10 is a drawing illustrating a schematic configuration of the light-emitting apparatus 100B. As illustrated in FIG. 10, the light-emitting apparatus 100B includes a plurality of light-emitting elements 1E. In the light-emitting apparatus 100B, regions surrounded by the edge cover 2 are pixel regions (subpixels) of each color, and the light-emitting apparatus 100B includes the red pixel region RP, the green pixel region GP, and the blue pixel region BP.

In the light-emitting apparatus 100B, the positive hole injection layer 15, the positive hole transport layer 14, the electron transport layer 12, and the cathode electrode 11 of the light-emitting element 1E formed for each of the red pixel region RP, the green pixel region GP, and the blue pixel region BP are commonly used.

The light-emitting apparatus 100B and the light-emitting element 1E of the present embodiment are manufactured by the following procedure. First, the anode electrode 16 electrically connected to the TFT is formed on the substrate B. Then, the edge cover 2 is formed on the anode electrode 16. Next, the positive hole injection layer 15 and the positive hole transport layer 14 are sequentially formed in the upper layer of the anode electrode 16 from below. The positive hole injection layer 15 and the positive hole transport layer 14 can be formed by being applied by a spin coating method, a spray coating method, an ink-jet method, or the like, or by vapor deposition using an open mask. Next, the second positive hole transport layers 14R, 14G, 14B are formed for the red pixel region RP, the green pixel region GP, and the blue pixel region BP using an ink-jet method. At this time, the edge cover 2 is used as a bank of the ink-jet applied material. Next, the light-emitting layer 13 is formed for each of the red pixel region RP, the green pixel region GP, and the blue pixel region BP by photolithography. Lastly, the electron transport layer 12 and the cathode electrode 11 are sequentially formed in the upper layer of the light-emitting layer 13 from below.

In the light-emitting element 1E, the second positive hole transport layers 14R, 14G, 14B are formed covering the opening of the edge cover 2 and a portion of the side surface of the opening of the edge cover 2. Further, in the light-emitting element 1E, the light-emitting layer 13 is formed covering the second positive hole transport layers 14R, 14G, 14B, an upper edge of the opening of the edge cover 2, and a portion of the upper edge of the edge cover 2.

Here, in the present embodiment, as described above, the light-emitting layer 13 is formed by photolithography capable of patterning with high accuracy. This makes it possible to ensure that color mixing of the light emitted from the light-emitting element 1E of each of the red pixel region RP, the green pixel region GP, and the blue pixel region BP does not occur, even if the second positive hole transport layers 14R, 14G, 14B applied by ink-jet overflow into adjacent subpixels.

Seventh Embodiment

A light-emitting apparatus 100C according to another embodiment of the disclosure will be described with reference to the drawings. Note that, for convenience of description, members having the same function as the members stated in the first embodiment are designated by the same reference signs, and descriptions thereof are omitted.

Figure 11:
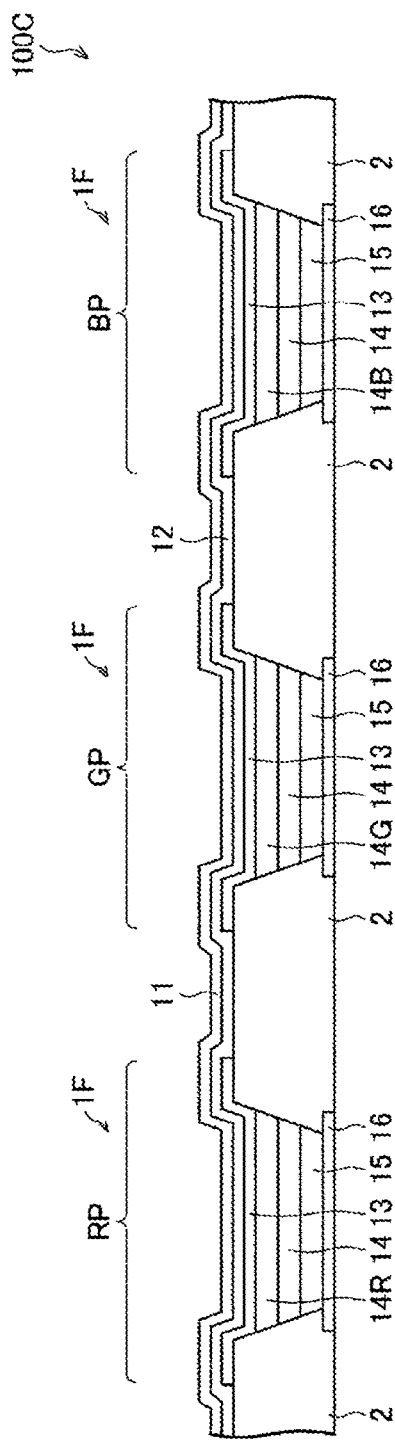
FIG. 11 is a drawing illustrating a schematic configuration of a light-emitting apparatus according to a seventh embodiment.

FIG. 11 is a drawing illustrating a schematic configuration of the light-emitting apparatus 100C. As illustrated in FIG. 11, the light-emitting apparatus 100C includes a plurality of light-emitting elements 1F. In the light-emitting apparatus 100C, regions surrounded by the edge cover 2 are pixel regions (subpixels) of each color, and the light-emitting apparatus 100C includes the red pixel region RP, the green pixel region GP, and the blue pixel region BP.

In the light-emitting apparatus 100C, the electron transport layer 12 and the cathode electrode 11 of the light-emitting element 1F formed for each of the red pixel region RP, the green pixel region GP, and the blue pixel region BP are commonly used.

The light-emitting apparatus 100C and the light-emitting element 1F of the present embodiment are manufactured by the following procedure. First, the anode electrode 16 electrically connected to the TFT is formed on the substrate B. Then, the edge cover 2 is formed on the anode electrode 16. Next, the positive hole injection layer 15, the positive hole transport layer 14, and the second positive hole transport layers 14R, 14G, 14B are sequentially formed in the upper layer of the anode electrode 16 from below using an ink-jet method. At this time, the edge cover 2 is used as a bank of the ink-jet applied material. Next, the light-emitting layer 13 is formed for each of the red pixel region RP, the green pixel region GP, and the blue pixel region BP by photolithography. Lastly, the electron transport layer 12 and the cathode electrode 11 are sequentially formed in the upper layer of the light-emitting layer 13 from below.

In the light-emitting element 1F, the second positive hole transport layers 14R, 14G, 14B are formed covering the opening of the edge cover 2 and a portion of the side surface of the opening of the edge cover 2. Further, in the light-emitting element 1F, the light-emitting layer 13 is formed covering the second positive hole transport layers 14R, 14G, 14B, the upper edge of the opening of the edge cover 2, a portion of the upper edge of the edge cover 2.

Here, in the present embodiment, as described above, the light-emitting layer 13 is formed by photolithography capable of patterning with high accuracy. This makes it possible to ensure that color mixing of the light emitted from the light-emitting element IF of each of the red pixel region RP, the green pixel region GP, and the blue pixel region BP does not occur, even if the second positive hole transport layers 14R, 14G, 14B applied by ink-jet overflow into adjacent subpixels.

Supplement

A light-emitting element (1, 1A to 1F) according to a first aspect of the disclosure includes an anode electrode (16), a cathode electrode (11), a light-emitting layer (13), a positive hole transport layer (14) configured to transport positive holes supplied from the anode electrode to the light-emitting layer, and an electron transport layer (12) configured to transport electrons supplied from the cathode electrode to the light-emitting layer. The light-emitting layer, the positive hole transport layer, and the electron transport layer are provided between the anode electrode and the cathode electrode. The light-emitting layer includes a photosensitive host material (13D), quantum dot phosphor particles (QD phosphor particles 13A, red QD phosphor particles 13Ar, green QD phosphor particles 13Ag, blue QD phosphor particles 13Ab) configured to emit light in association with a bonding of the positive holes and the electrons, and at least one of a positive hole transport substance (13B) configured to transport the positive holes transported thereto by the positive hole transport layer and an electron transport substance (13C) configured to transport the electrons transported thereto by the electron transport layer.

According to the configuration described above, the transport properties of at least one of the positive holes and electrons in an interior of the light-emitting layer can be improved. This makes it possible to adjust a balance between the amount of positive holes and the amount of electrons supplied to the quantum dot phosphor particles. As a result, a luminous efficiency of the quantum dot phosphor particles can be improved, and a service life of the light-emitting element including the quantum dot phosphor particles can be lengthened.

In the light-emitting element according to a second aspect of the disclosure, in the first aspect described above, the light-emitting layer includes both the positive hole transport substance and the electron transport substance.

According to the configuration described above, the transport properties of both the positive holes and the electrons in the interior of the light-emitting layer can be improved. The luminous efficiency of the quantum dot phosphor particles can be further improved.

In the light-emitting element according to a third aspect of the disclosure, in the first or second aspect described above, the light-emitting layer may include the positive hole transport substance, and a substance having positive hole transport properties and included in the positive hole transport layer and the positive hole transport substance may be the same substance.

In the light-emitting element according to a fourth aspect of the disclosure, in the third aspect described above, a highest occupied molecular orbital (HOMO) level of the light-emitting layer and a HOMO level of the positive hole transport layer are the same level.

In the light-emitting element according to a fifth aspect of the disclosure, in any one of the first to fourth aspects described above, the light-emitting layer may include the electron transport substance, and a substance having electron transport properties and included in the electron transport layer and the electron transport substance may be the same substance.

In the light-emitting element according to a sixth aspect of the disclosure, in the fifth aspect described above, a lowest unoccupied molecular orbital (LUMO) level of the light-emitting layer and a LUMO level of the electron transport layer may be the same level.

The light-emitting element according to a seventh aspect of the disclosure may further include an electron blocking layer (17) constituted by only the photosensitive host material, between the positive hole transport layer and the light-emitting layer.

The light-emitting element according to an eighth aspect of the disclosure may, in any one of the first to sixth aspects described above, further include an electron blocking layer constituted by the photosensitive host material and the positive hole transport substance, between the positive hole transport layer and the light-emitting layer.

The light-emitting element according to a ninth aspect of the disclosure may, in any one of the first to eighth aspects described above, further include a positive hole blocking layer (18) constituted by only the photosensitive host material, between the electron transport layer and the light-emitting layer.

The light-emitting element according to a tenth aspect of the disclosure may, in any one of the first to eighth aspects described above, further include a positive hole blocking layer constituted by the photosensitive host material and the electron transport substance, between the electron transport layer and the light-emitting layer.

In the light-emitting element according to an eleventh aspect of the disclosure, in any one of the first to tenth aspects described above, the photosensitive host material may be negative-working.

The light-emitting element according to a twelfth aspect of the disclosure may, in any one of the first to eleventh aspect described above, further include an edge cover, between the anode electrode and the light-emitting layer, configured to cover a peripheral edge of the anode electrode and including an opening exposing a portion of the anode electrode. The light-emitting layer may be configured to cover the opening of the edge cover, a side surface of the opening, and a portion of an upper edge of the edge cover, and the positive hole transport layer may have a width greater than a width of the light-emitting layer.

The light-emitting element according to a thirteenth aspect of the disclosure may, in any one of the first to eleventh aspects described above, further include an edge cover, between the anode electrode and the light-emitting layer, configured to cover a peripheral edge of the anode electrode and including an opening exposing a portion of the anode electrode. The light-emitting layer may be configured to cover the opening of the edge cover, a side surface of the opening, and a portion of an upper edge of the edge cover, and the positive hole transport layer may be configured to cover the opening of the edge cover and a portion of the side surface of the opening.

A method for manufacturing a light-emitting element according to a fourteenth aspect of the disclosure is a method for manufacturing a light-emitting element including an anode electrode, a cathode electrode, a light-emitting layer, a positive hole transport layer configured to transport positive holes supplied from the anode electrode to the light-emitting layer, and an electron transport layer configured to transport electrons supplied from the cathode electrode to the light-emitting layer, the light-emitting layer, the positive hole transport layer, and the electron transport layer being provided between the anode electrode and the cathode electrode. The method includes a light-emitting layer formation step of forming the light-emitting layer. The light-emitting layer formation step includes an application step of applying, on a base material, a liquid including a photosensitive host material, quantum dot phosphor particles configured to emit light in association with a bonding of the positive holes and the electrons, and at least one of a positive hole transport substance configured to transport the positive holes transported thereto by the positive hole transport layer and an electron transport substance configured to transport the electrons transported thereto by the electron transport layer, an exposure step of exposing the photosensitive host material, and a development step of developing the photosensitive host material. The photosensitive host material is developed and the light-emitting layer is patterned.

In the method for manufacturing a light-emitting element according to a fifteenth aspect of the disclosure, in the application step, a liquid including both the positive hole transport substance and the electron transport substance may be applied.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in each of the embodiments.

The invention claimed is:

1. A light-emitting element comprising:
   an anode electrode;
   a cathode electrode;
   a light-emitting layer;
   a positive hole transport layer configured to transport positive holes supplied from the anode electrode to the light-emitting layer; and
   an electron transport layer configured to transport electrons supplied from the cathode electrode to the light-emitting layer, wherein:
   the light-emitting layer, the positive hole transport layer, and the electron transport layer are provided between the anode electrode and the cathode electrode,
   the light-emitting layer includes a photosensitive host material for patterning the light-emitting layer by exposure and development, the photosensitive host material being a combination of a photosensitive resin and a photopolymerization initiator,
   quantum dot phosphor particles are configured to emit light in association with a bonding of the positive holes and the electrons,
   at least one of a positive hole transport substance is configured to transport the positive holes transported thereto by the positive hole transport layer, and an electron transport substance is configured to transport the electrons transported thereto by the electron transport layer,
   the photosensitive host material is different material from the positive hole transport substance and the electron transport substance, and
   the quantum dot phosphor particles directly contact with the photosensitive host material.

2. The light-emitting element according to claim 1, wherein the light-emitting layer includes both the positive hole transport substance and the electron transport substance.

3. The light-emitting element according to claim 1, wherein:
   the light-emitting layer includes the positive hole transport substance and a substance that has positive hole transport properties and that is included in the positive hole transport layer, and
   the substance that has the positive hole transport properties and the positive hole transport substance are the same substance.

4. The light-emitting element according to claim 3, wherein a highest occupied molecular orbital (HOMO) level of the light-emitting layer and a HOMO level of the positive hole transport layer are the same level.

5. The light-emitting element according to claim 1, wherein:
   the light-emitting layer includes the electron transport substance and a substance that has electron transport properties and that is included in the electron transport layer, and
   the substance that has the electron transport properties and the electron transport substance are the same substance.

6. The light-emitting element according to claim 5, wherein a lowest unoccupied molecular orbital (LUMO) level of the light-emitting layer and a LUMO level of the electron transport layer are the same level.

7. The light-emitting element according to claim 1, further comprising:

an electron blocking layer constituted by only the photosensitive host material, wherein the electron blocking layer is interposed between the positive hole transport layer and the light-emitting layer.

8. The light-emitting element according to claim 1, further comprising:
an electron blocking layer constituted by the photosensitive host material and the positive hole transport substance, wherein the electron blocking layer is interposed between the positive hole transport layer and the light-emitting layer.

9. The light-emitting element according to claim 1, further comprising:
a positive hole blocking layer constituted by only the photosensitive host material, wherein the positive hole blocking layer is interposed between the electron transport layer and the light-emitting layer.

10. The light-emitting element according to claim 1, further comprising:
a positive hole blocking layer constituted by the photosensitive host material and the electron transport substance, wherein the positive hole blocking layer is interposed between the electron transport layer and the light-emitting layer.

11. The light-emitting element according to claim 1, wherein the photosensitive host material is negative-working.

12. The light-emitting element according to claim 1, further comprising:
an edge cover, between the anode electrode and the light-emitting layer, configured to cover a peripheral edge of the anode electrode and including an opening exposing a portion of the anode electrode, wherein:
the light-emitting layer is configured to cover the opening of the edge cover, a side surface of the opening, and a portion of an upper edge of the edge cover, and
the positive hole transport layer has a width greater than a width of the light-emitting layer.

13. The light-emitting element according to claim 1, further comprising:
an edge cover, between the anode electrode and the light-emitting layer, configured to cover a peripheral edge of the anode electrode and including an opening exposing a portion of the anode electrode, wherein:
the light-emitting layer is configured to cover the opening of the edge cover, a side surface of the opening, and a portion of an upper edge of the edge cover, and
the positive hole transport layer is configured to cover the opening of the edge cover and a portion of the side surface of the opening.

14. A method for manufacturing a light-emitting element including:
an anode electrode,
a cathode electrode,
a light-emitting layer,
a positive hole transport layer configured to transport positive holes supplied from the anode electrode to the light-emitting layer, and
an electron transport layer configured to transport electrons supplied from the cathode electrode to the light-emitting layer,
the light-emitting layer, the positive hole transport layer, and the electron transport layer being provided between the anode electrode and the cathode electrode,
the method comprising:
forming the light-emitting layer by:
applying, on a base material, a liquid including a photosensitive host material for patterning the light-emitting layer by exposure and development, quantum dot phosphor particles configured to emit light in association with a bonding of the positive holes and the electrons, and at least one of a positive hole transport substance configured to transport the positive holes transported thereto by the positive hole transport layer and an electron transport substance configured to transport the electrons transported thereto by the electron transport layer, the photosensitive host material being a combination of a photosensitive resin and a photopolymerization initiator;
exposing the photosensitive host material;
developing the photosensitive host material; and
patterning the light-emitting layer,
wherein the photosensitive host material is different material from the positive hole transport substance and the electron transport substance, and
the quantum dot phosphor particles directly contact with the photosensitive host material.

15. The method for manufacturing the light-emitting element according to claim 14,
wherein, the liquid includes both the positive hole transport substance and the electron transport substance.

* * * * *